(12) United States Patent
Lin et al.

(10) Patent No.: US 8,906,583 B2
(45) Date of Patent: Dec. 9, 2014

(54) STACKED MASK

(71) Applicant: Taiwan Semiconductor Manufacturing Company, Ltd., Hsin-Chu (TW)

(72) Inventors: Burn Jeng Lin, Hsinchu (TW);
Hsin-Chang Lee, Zhubei (TW);
Sheng-Chi Chin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 69 days.

(21) Appl. No.: 13/722,646

(22) Filed: Dec. 20, 2012

(65) Prior Publication Data
US 2014/0178804 A1 Jun. 26, 2014

(51) Int. Cl.
*G03F 1/50* (2012.01)
*G03F 1/26* (2012.01)
*G03F 1/58* (2012.01)

(52) U.S. Cl.
CPC ...................................... *G03F 1/58* (2013.01)

USPC .............................................................. 430/5

(58) Field of Classification Search
USPC ........................ 430/5, 322, 323, 394; 378/35
See application file for complete search history.

(56) References Cited

U.S. PATENT DOCUMENTS

| 8,679,706 | B2 * | 3/2014 | Choi ................................. | 430/5 |
| 2003/0068563 | A1 * | 4/2003 | Hong et al. ....................... | 430/5 |
| 2004/0265706 | A1 * | 12/2004 | Montgomery et al. ........... | 430/5 |

* cited by examiner

*Primary Examiner* — Stephen Rosasco
(74) *Attorney, Agent, or Firm* — Haynes & Boone, LLP (57) ABSTRACT

The present disclosure describes a mask. The mask includes a low thermal expansion material (LTEM) substrate, at least two absorber layers, and a spacer layer separating the two absorber layers. The first absorber layer is deposited over the LTEM substrate. The mask further includes a topcoat layer over the absorber layer. A thickness of the spacer layer is approximately equal to a height of a topography feature on a wafer substrate multiplied by the square of a demagnification of an objective lens. The absorber layers include staged patterns.

20 Claims, 9 Drawing Sheets

STACKED MASK

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, as the size of a feature is scaled down, a resolution of an optical lithography system is improved. However, a depth of focus (DOF) is decreased as a consequence of improved resolution. In many cases, the DOF is barely sufficient to support a resist film thickness, wafer flatness, and planarization tolerance of the IC device, focusing and leveling errors of the optical lithography system. Accordingly, what is needed is a method to improve the DOF of the optical lithography system.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
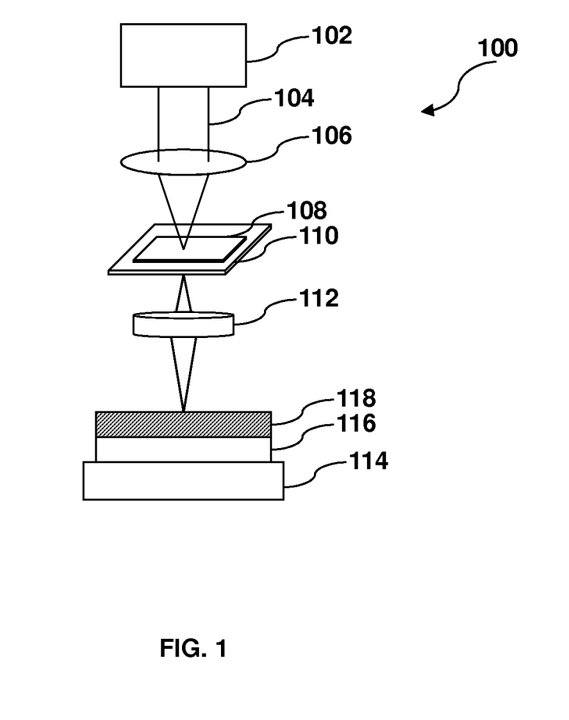
FIG. 1 represents a diagram of an optical lithography system for benefitting from one or more embodiments of the present disclosure.

Referring now to FIG. 1, an optical lithography system 100 is an example of a system that can benefit from one or more embodiments of the present disclosure. The optical lithography system 100 includes a light source 102, a light 104, a condense lens 106, a photomask 108, a mask stage 110, a projection lens 112, a substrate stage 114, a substrate 116 and a resist film 118. However, other configurations and inclusion or omission of certain devices may be possible. In the present disclosure, the system 100 is also referred to as a stepper or a scanner, and the photo mask 108 is also referred to as a mask or a reticle. In the present embodiment, the light source 102 includes a radiation source providing the light 104 having a wavelength range from UV to DUV. For example, a mercury lamp provides UV wavelength, such as G-line (436 nm) or I-line (365 nm). As another example, an excimer laser provides DUV wavelength, such as 248 nm, 193 nm, or 157 nm. The condense lens 106 is configured to guide the light 104 to the photomask 108. The photomask 108 blocks a portion of the light 204 and provides an aerial image of the light 104 to form the patterned light 104. The photomask 108 may be a binary mask (BIM), a super binary mask (SBIM), or a phase shift mask (PSM), which includes an alternative phase shift mask (alt. PSM) or an attenuated phase shift mask (att. PSM). The photo mask 108 is positioned on the mask stage 110. The mask stage 110 includes a plurality of motors, roller guides, and tables. The mask stage 110 also secures the photomask 108 on the mask stage 110 by vacuum. The mask stage 110 further provides accurate position and movement of the photomask 208 in X, Y, and Z directions during alignment, focus, leveling and exposure operation in the optical lithography system 100. The projection lens 112 includes a magnification lens for reducing the pattern image provided by the photomask 108 and guides the patterned light 104 to the resist film 118 deposited on the substrate 116 secured by the substrate stage 114. The substrate stage 114 includes motors, roller guides, and tables. The substrate stage 114 also secures the substrate 116 by vacuum. The substrate stage further provides accurate position and movement of the substrate 116 in X, Y, and Z directions during alignment, focus, leveling and exposure operations in the optical lithography system 100 so that the image of the photomask is transferred onto the substrate in a repetitive fashion (though other lithography methods are possible). The optical lithography system 100, or portions thereof, may include additional items, such as a vacuum system and/or a cooling system.

Continuing with the present embodiments, the substrate 116 deposited with the resist film 118 is loaded on the substrate stage 114 for exposure by the patterned light 104. The resist film 118 includes a positive tone resist or a negative tone resist. The substrate 116 includes a wafer substrate. The wafer substrate includes a silicon wafer. Alternatively or additionally, the wafer may includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP. In yet another alternative, the wafer is a semiconductor on insulator (SOI). A plurality of conductive and non-conductive thin films may be deposited on the wafer. For example, the conductive thin films may include a metal such as aluminum (Al), copper (Cu), tungsten (W), nickel (Ni), titanium (Ti), gold (Au), and platinum (Pt), or alloys thereof. The insulator film may include silicon oxide or silicon nitride.

In the present embodiments, the wafer substrate 116 further includes various doped features, such as n-type wells and/or p-type wells, formed by ion implantation or diffusion. The wafer substrate 116 also includes various isolation features, such as shallow trench isolation (STI). The STI feature may have a significant topography impact on the wafer substrate. As feature sizes are being scaled down, a resolution of the optical lithography system 100 is improved. However, this involves a depth of focus (DOF) trade-off. In many cases, the DOF is barely sufficient to support the resist film thickness, wafer flatness and planarization tolerance, focusing and leveling errors. When systematic topography cannot be further planarized, the DOF budget can be exceeded, which is undesirable.

Figure 2:
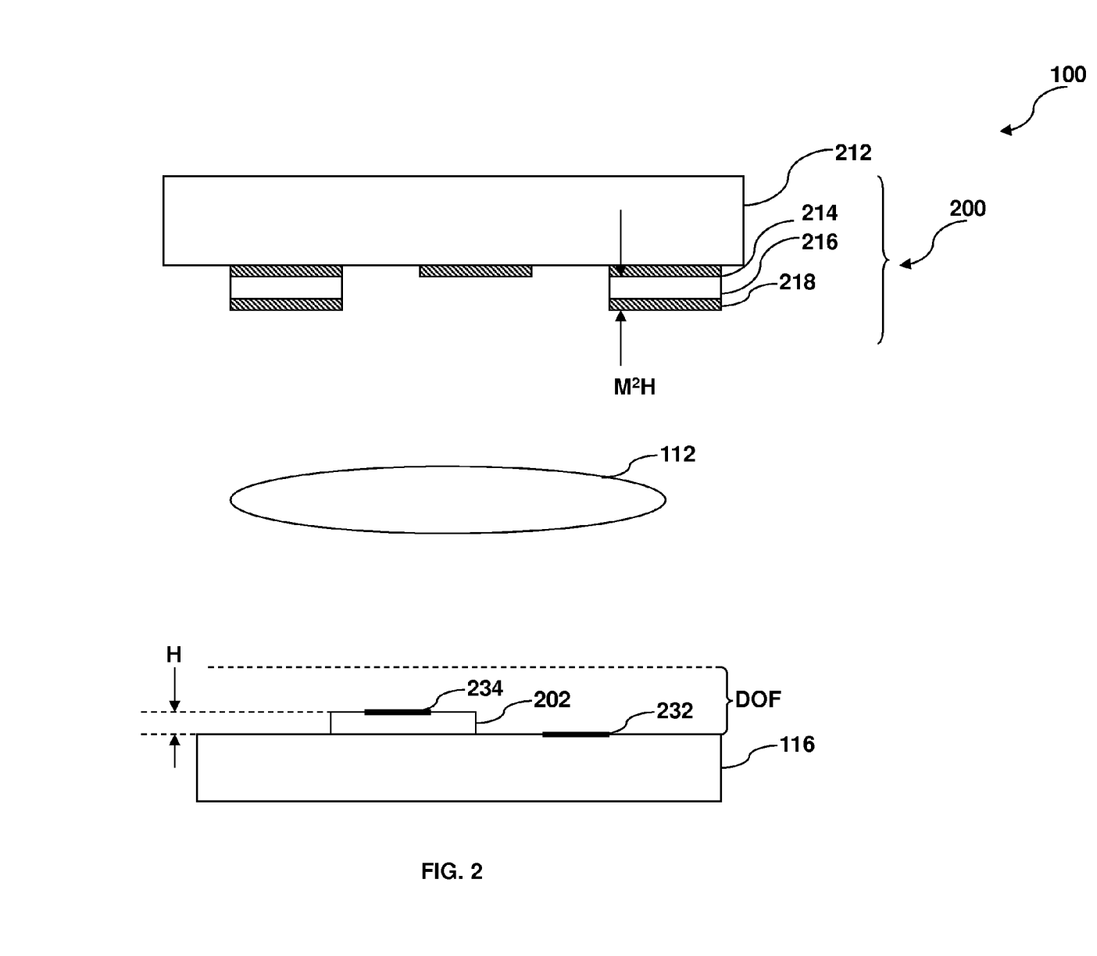
FIG. 2 represents an example of a two-stage mask being used in an optical lithography system according to one or more embodiments of the present disclosure.

Referring now to FIG. 2, a cross section view of a stacked mask 200 exposing the topography wafer 116 using the optical lithography system 100 is illustrated. As shown in FIG. 2, the wafer 116 includes a topography feature 202. A distance between the top surface of the topography feature 202 and the top surface of the wafer 116 is represented by H shown in FIG. 2. In some embodiments, a distance between the top surface of the topography feature and the top surface of the wafer is also referred to as a height of the topography feature. The projection lens 112 includes a lens with MX demagnification, for example, 4× for the projection lens on a scanner, or, 5× for the projection lens on a stepper.

As shown in FIG. 2, the stacked mask 200 includes a low thermal expansion material (LTEM) substrate 212, a first absorber layer 214, a first spacer layer 216, and a second absorber layer 218. The first absorber layer 214 is deposited over the LTEM substrate 212. The first spacer layer 216 is deposited over the first absorber layer 214. The second absorber layer 218 is deposited over the first spacer layer 216. A thickness of the first spacer 216 is approximately $M^2H$. A thickness of the second absorber layer 218 is negligible compared to the thickness of the first spacer 216. For example, if the distance H is 100 nm and the stacked mask 200 uses a 4× scanner. The thickness of the first spacer 216 is approximate 1600 nm ($4^2 \times 100 = 1600$).

As shown in FIG. 2, the stacked mask 200 generates two image planes above the wafer 116, for example, a first image plane 232 and a second image plane 234. The first image plane 232 forms near the top surface of the wafer 116. The second image plane 234 forms near the top surface of the topography feature 202. The distance between the first image plane 232 and the second image plane 234 is equal to H. Both the first image plane 232 and the second image plane 234 are located within the DOF range.

Figure 3:
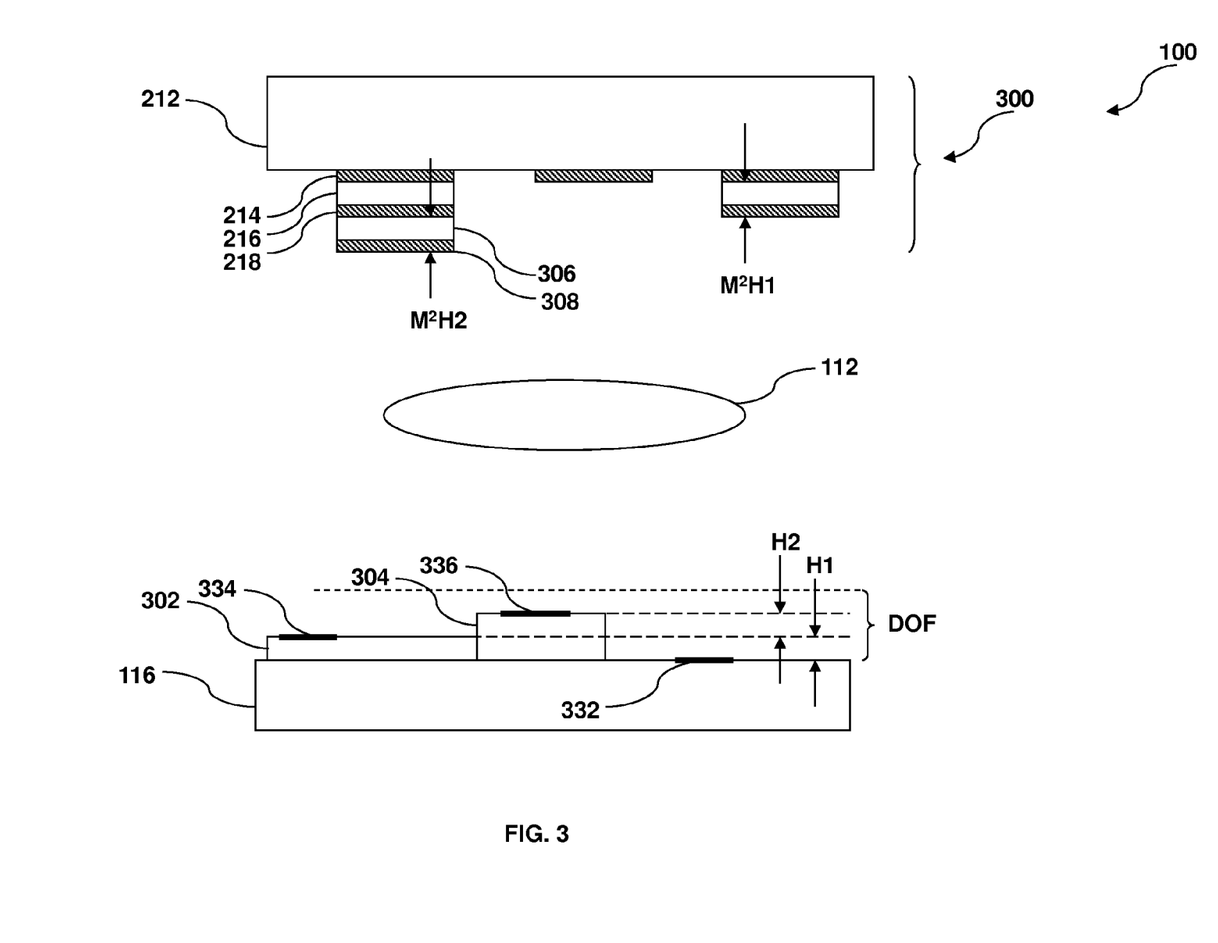
FIG. 3 represents an example of a three-stage mask being used in an optical lithography system according to one or more embodiments of the present disclosure.

Referring now to FIG. 3, a cross section view of a stacked mask 300 exposing the topography wafer 116 using the optical lithography system 100 is illustrated. As shown in FIG. 3, the wafer 116 includes two topography features, a topography feature 302 and a topography feature 304. A distance between the top surface of the topography feature 302 and the top surface of the wafer 116 is represented by H1 shown in FIG. 4. The distance between the top surface of the topography feature 302 and the top surface of the topography feature 304 is represented by $H_2$ shown in FIG. 4. The projection lens 112 includes a lens with MX demagnification, for example, 4× for the projection lens on a scanner, or, 5× for the projection lens on a stepper.

As shown in FIG. 3, the stacked mask 300 includes the low thermal expansion material (LTEM) substrate 212, the first absorber layer 214, the first spacer layer 216, the second absorber layer 218, a second spacer layer 306, and a third absorber layer 308. The first absorber layer 214 is deposited over the LTEM substrate 212. The first spacer layer 216 is deposited over the first absorber layer 214. The second absorber layer 218 is deposited over the first spacer layer 216. The second spacer layer 306 is deposited over the second absorber layer 218. The third absorber layer 308 is deposited over the second spacer layer 306. The thickness of the first spacer 216 is approximate $M^2H_1$. The thickness of the second absorber layer 218 is negligible compared to the first spacer 216. For example, if the distance $H_1$ is 100 nm and the stacked mask 300 uses a 4× scanner, the thickness of the first spacer layer 216 is approximate 1600 nm ($4^2 \times 100 = 1600$). The thickness of the second spacer layer 306 is approximate $M^2H_2$. The thickness of the third absorber layer 308 is negligible compared to the second spacer layer 306. For example, if the distance $H_2$ is 100 nm, the thickness of the second spacer layer 306 is approximate 1600 nm ($4^2 \times 100 = 1600$).

As shown in FIG. 3, the stacked mask 300 generates three image planes above the wafer 116, for example, a first image plane 332, a second image plane 334, and a third image plane 336. The first image plane 332 forms near the top surface of the wafer 116. The second image plane 334 forms near the top surface of the topography feature 302. The third image plane 336 forms near the top surface of the topography feature 304. All three image planes locate within the DOF range. In the present embodiments, the stacked mask 200 or 300 can apply to discrete topography feature or to continuously carrying topography.

Figure 4:
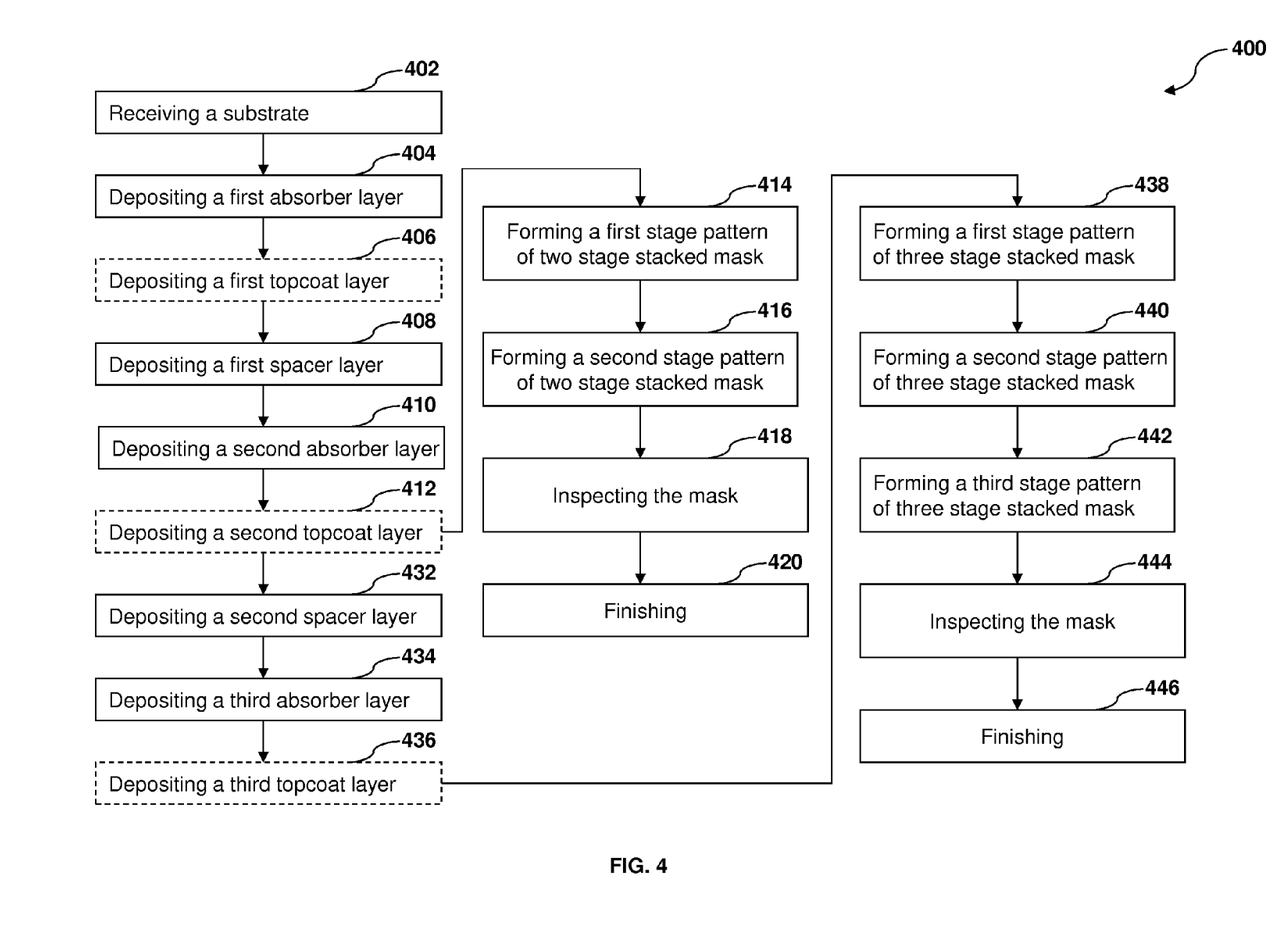
FIG. 4 is a flow chart of making a staged mask for implementing one or more embodiments of the present disclosure.

Referring now to FIG. 4, a method 400 can be used to form the stacked mask for implementing one or more embodiments of the present disclosure. The method 400 begins at step 402 by providing or receiving a mask substrate. Then, the method 400 proceeds to step 404 by depositing a first absorber layer over a surface of the mask substrate. After step 404, the method 400 proceeds to step 406 by depositing a first topcoat layer over the first absorber layer. The step 406 is an optional step. The stacked mask may not include the first topcoat layer. The step 406 may also include depositing an etching stop layer. The method 400 further proceeds to step 408 by depositing a first spacer layer over the first topcoat layer or over the first absorber layer if the optional step 406 is skipped. The method 400 proceeds to step 410 by depositing a second absorber layer over the first spacer layer. The method 400 proceeds to step 412 by depositing a second topcoat over the second absorber layer. The step 412 is an optional step. The stacked mask may not include the second topcoat layer.

As shown in FIG. 4, the method 400 may proceed to step 414 by forming a first stage pattern of two stage stacked mask 200 as shown in FIG. 2. The step 414 includes coating a first resist film on the second topcoat layer, or on the second absorber layer if the optional topcoat layer is skipped, by a spin-on process, exposing the first resist film by a mask writer, developing the exposed first resist film to form a first resist pattern, and etching the first resist pattern so that the first stage pattern of two stage stacked mask is formed. In some embodiments, exposing a resist film is also referred to as writing a resist film using the mask writer. The step 414 may include a soft bake (SB) after coating the first resist film, a post exposing bake (PEB) before developing and/or post developing bake (PDB) after developing. The step 414 also includes stripping the first resist film after the etching process and cleaning the surface for next step. The method 400 proceeds to step 416 by forming a second stage pattern of two stage stacked mask. The step 416 includes depositing a second resist film over the first stage pattern by a spin-on process, exposing the second resist film by the mask writer, developing the exposed second resist film to form a second resist pattern, and etching the second resist pattern so that the second stage pattern of the two stage stacked mask is formed. The step 416 may include a soft bake (SB) after coating the first resist film, a post exposing bake (PEB) before developing and/or post developing bake (PDB) after developing. The step 416 also includes stripping the first resist film after the etching process and cleaning the surface for next step. The method 400 proceeds to step 418 by inspecting the formed mask. The step 418 may include repairing the mask if a defect is found. In one embodiment, the step 418 may also be performed before the step 416 and after the step 416. After final inspection, the method 400 proceeds to step 420 by finishing fabricating the two stage stacked mask. Additional steps can be provided before, during, and after the method 400, and some of the steps described can be replaced, eliminated, or moved around for additional embodiments of the method 400.

In some embodiments, after the step 412 or the step 410 if the optional step 412 is skipped, the method 400 may continue proceeding along another route for forming the three stage stacked mask 300 shown s in FIG. 3. The method 400 proceeds to step 432 by deposing a second spacer layer over the second topcoat layer, or over the second absorber layer if the optional step 412 is skipped. After step 432, the method 400 proceeds to step 434 by depositing a third absorber layer over the second spacer layer. The method 400 proceeds to step 436 by depositing a third topcoat layer over the third absorber layer. The step 436 is an optional step. Therefore, the stacked mask may not include the third topcoat layer.

As shown in FIG. 4, the method 400 proceeds to step 438 by forming a first stage pattern of three stages stacked mask 300 as shown in FIG. 3. The step 438 includes depositing a first resist film on the third topcoat layer, or on the third absorber layer if the optional third topcoat layer is skipped, by a spin-on process, exposing the first resist film by a mask writer, developing the exposed first resist film to form the first resist pattern, and etching the first resist pattern so that the first stage pattern of the three stage stacked mask is formed. The step 438 may include a soft bake (SB) after coating the first resist film, a post exposing bake (PEB) before developing and/or post developing bake (PDB) after developing. The step 438 also includes stripping the first resist film after the etching process and cleaning the surface for next step. The method 400 proceeds to step 440 by forming a second stage pattern of the three stacked mask. The step 440 includes depositing a second resist film over the first stage pattern, for example, by a spin-on process, exposing the second resist film by the mask writer, developing the exposed second resist film to form a second resist pattern, and etching the second resist pattern so that the second stage pattern of the three stage stacked mask is formed. The step 440 may include a soft bake (SB) after coating the first resist film, a post exposing bake (PEB) before developing and/or post developing bake (PDB) after developing. The step 440 also includes stripping the first resist film after the etching process and cleaning the surface for next step. The method 400 proceeds to step 442 by forming a third stage pattern of the three stage stacked mask. The step 442 includes depositing a third resist film over the second stage pattern by a spin-on process, exposing the third resist film by the mask writer, developing the exposed third resist film to form a third resist pattern, and etching the third resist pattern so that the second stage pattern of two stage stacked mask is formed. The step 442 may include a soft bake (SB) after coating the first resist film, a post exposing bake (PEB) before developing and/or post developing bake (PDB) after developing. The step 442 also includes stripping the first resist film after the etching process and cleaning the surface for next step. The method 400 proceeds to step 444 by inspecting the formed mask. The step 444 may include repairing the mask if a defect is found. In one embodiment, the step 444 may also be performed before the step 440 and/or after the step 440. After final inspection, the method 400 proceeds to step 446 by finishing fabricating the three stage stacked mask. Additional steps can be provided before, during, and after the method 400, and some of the steps described can be replaced, eliminated, or moved around for additional embodiments of the method 400.

In the foregoing discussion involving the method 400, various layers, such as the absorber layer, the spacer layer, and the topcoat layer, are deposited by a physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), atomic layer deposition (ALD) and/or other methods known in the art. In the present embodiments, the etching process may include dry (plasma) etching, wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 5:
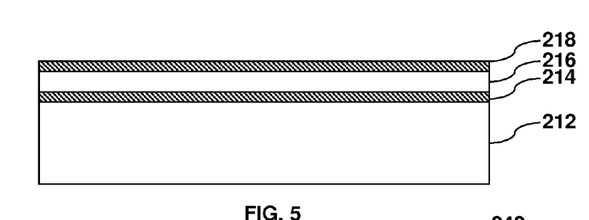
FIGS. 5-10 represent cross section views of forming a two-stage mask according to one or more embodiments of the present disclosure.

Referring now to FIGS. 5-10, cross section reviews of forming the stacked mask 200 using the method 400 are illustrated according to one or more embodiments. As shown in FIG. 5, the first absorber layer 214 is deposited over the LTEM substrate 212, the first spacer layer 216 is deposited over the first absorber layer 214, and the second absorber layer 218 is deposited over the first spacer layer 216. In some embodiments, the LTEM substrate 212 may include fused silica, fused quartz, calcium fluoride ($CaF_2$), silicon carbide, silicon oxide-titanium oxide alloy and/or other suitable LTEM. The first absorber layer 214 or the second absorber layer 218 may include chromium, and its compounds such as CrN, CrON, and CrO in one embodiment; Molybdenum and its compounds such as MoSi, MoSiN, and MoSiON in another embodiment; and tantalum and its compounds such as TaN, TaON, TaB, TaBN, TaHfN, TaHf, TaSi, TaSiN, TaGe, TaGeN, TaZrN, and TaZr in other embodiments. In some embodiments, the first spacer layer 216 may include either opaque a transparent materials. The opaque material may include MoSi-based compounds such as MoSi, MoSiON, and MoSiN; silicon and silicon compounds; and tantalum and its compounds. The transparent materials may include silicon oxides, silicon oxides doped with zirconium, barium, lanthanum, aluminum, sodium, phosphorus, sulfur, selenium, and/or tellurium.

Figure 6:
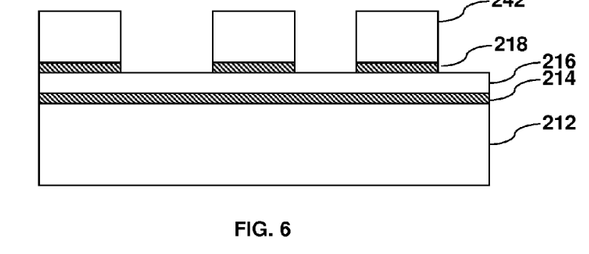
Figure 7:
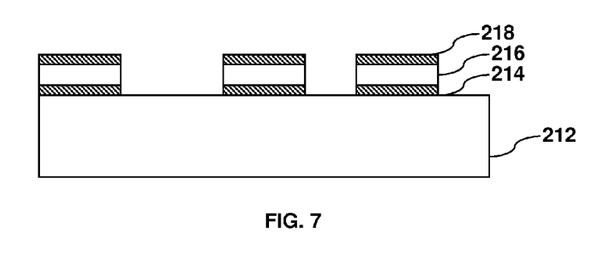
Figure 8:
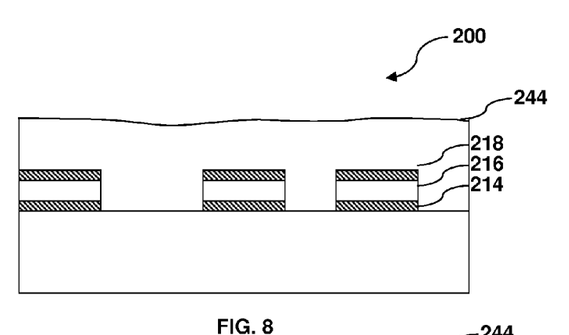
Figure 9:
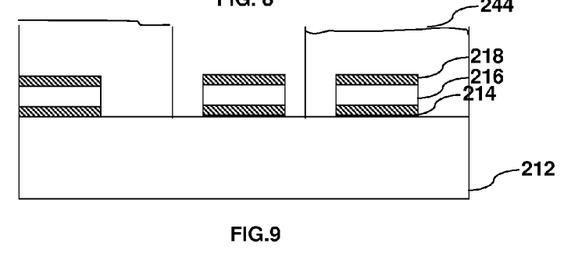
Figure 10:
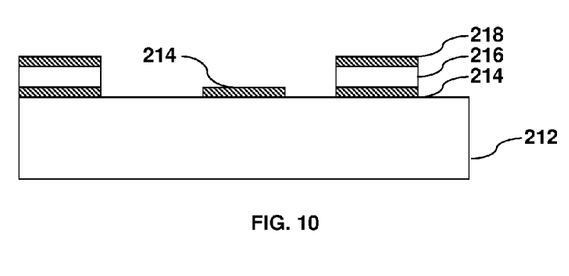

Continuing on with the embodiments shown herein, a first resist film 242 is coated on the second absorber layer 218. After exposing, developing, and etching process, the patterned second absorber layer 218 is formed on the first spacer layer 216 as shown in FIG. 6. After the first resist film 242 is stripped, the etching process is applied by using the patterned second absorber layer 218 as a hard mask to form the first stage pattern of the stacked mask 200 (two stage stacked mask) as shown in FIG. 7. A second resist film 244 is applied to the first stage pattern of the mask 200 as shown in FIG. 8. After exposing and developing, the patterned second resist film is formed as shown in FIG. 9. After etching, striping and cleaning, the mask 200 is formed as shown in FIG. 10 using the method 400.

Figure 11:
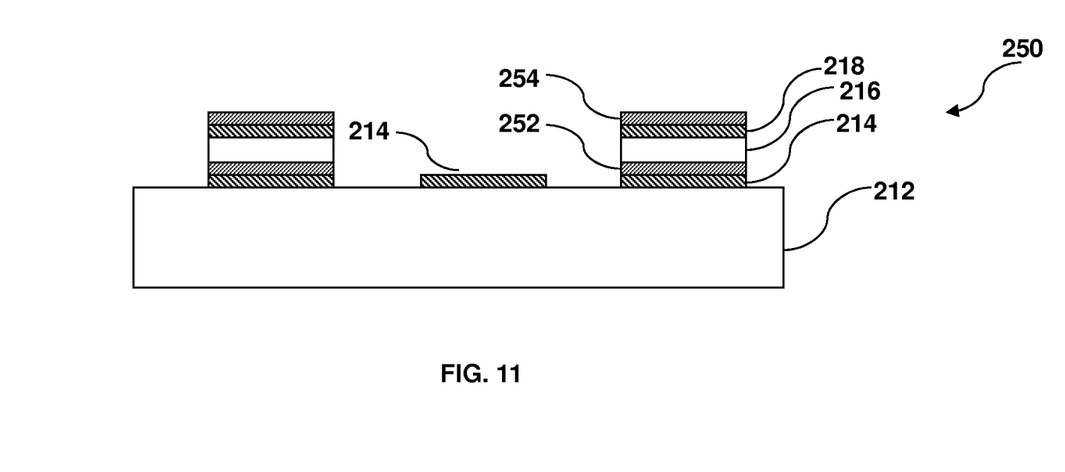
FIG. 11 is an example of a two-stage mask according to one or more embodiments of the present disclosure.

Referring now to FIG. 11, a cross section view of a stacked mask 250 is illustrated according to one or more embodiments. The stacked mask 250 includes two stage patterns. The stacked mask 250 can be fabricated by the method 400 as shown in FIG. 4. The stacked mask 250 is similar to the stacked mask 200 as shown in FIG. 10. The stacked mask 250 includes the low thermal expansion material (LTEM) substrate 212, the first absorber layer 214, the spacer layer 216, the second absorber layer 218, a first topcoat layer 252, and a second topcoat layer 254. In addition to the absorber layer and the spacer layer, a topcoat layer is deposited over the absorber layer for various purposes, such as anti-reflection, protection of the absorber layer, or differential etch stop.

As shown in FIG. 11, the first absorber layer 214 is deposited over the LTEM substrate 212. The first topcoat layer 252 is deposited over the first absorber layer 214. The first spacer layer 216 is deposited over the first topcoat layer 254. The second absorber layer 218 is deposited over the first spacer layer 216. The second topcoat layer 254 is deposited over the second absorber layer 218. In some embodiments, the first topcoat layer 252 or the second topcoat layer 254 may include Cr-based compounds, Ta-based compounds, and Si-based compound. The Cr-based compounds include CrN, CrON, or CrO. The Ta-based compounds may include TaO, or TaON. The Si-based compounds include SiO, $SiO_2$, SiN or SiON.

Figure 12:
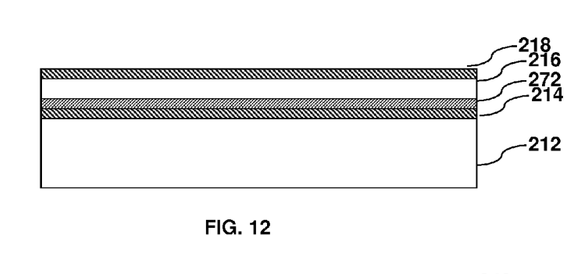
FIGS. 12-17 represent cross section views of forming a two-stage mask according to one or more embodiments of the present disclosure.
Figure 13:
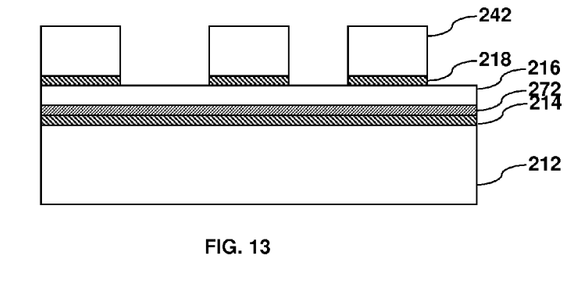
Figure 14:
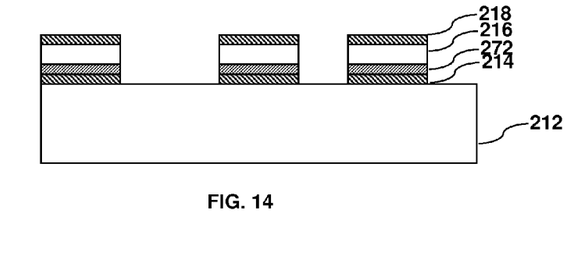
Figure 15:
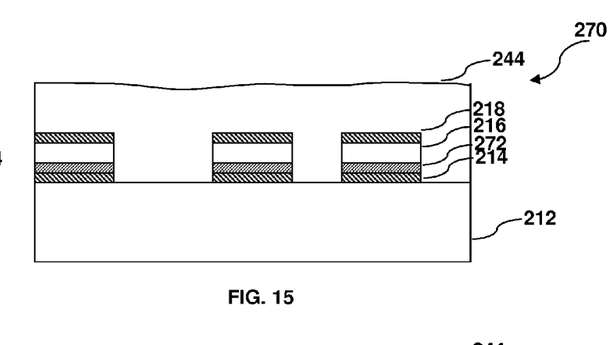
Figure 16:
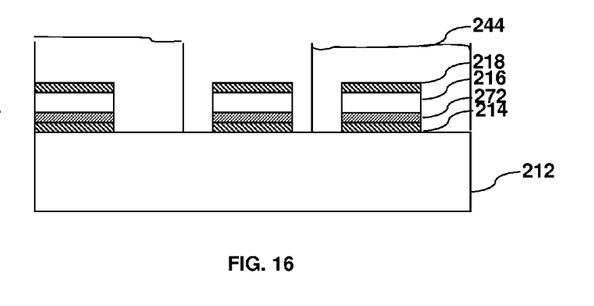
Figure 17:
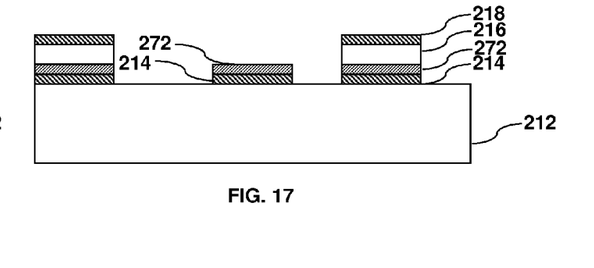

Referring now to FIGS. 12-17, cross section views of forming a stacked mask 270 using the method 400 are illustrated according to one or more embodiments. As shown in FIG. 12, the first absorber layer 214 is deposited over the LTEM substrate 212, an etching stop layer 272 is deposited over the first absorber layer 214, the first spacer layer 216 is deposited over the etching stop layer 272, the second absorber layer 218 is deposited over the first spacer layer 216. After the deposition, the first resist film 242 is deposited on the second absorber layer 218. After exposing, developing, and etching process, the patterned second absorber layer 218 is formed on the first spacer layer 216 as shown in FIG. 13. After the first resist film 242 is stripped, the etching process is applied by using the patterned second absorber layer 218 as a hard mask to form the first stage pattern of the stacked mask 270 (two stage stacked mask) as shown in FIG. 14. A second resist film 244 is applied to the first stage pattern of the stacked mask 270 as shown in FIG. 15. After exposing and developing, the patterned second resist film 244 is formed as shown in FIG. 16. After etching, striping, and cleaning, the stacked mask 270 is formed as shown in FIG. 17 using the method 400.

In some embodiments, the etching stop layer 272 is added between the first absorber layer 214 and the first spacer layer 216 to facilitate differential etching. The etching stop layer 272 has a much slower etch rate in the etching environment of the absorber/spacer removal. The etching stop layer 272 is different for different etch environments. When $CHF_3$, $CF_4$, and/or $SF_6$ are used as the etching gas to etch absorbers MoSi, MoSiN, MoSiON, TaN, TaON, TaB, TaBN, TaHfN, TaHf, TaSi, TaSiN, TaGe, TaGeN, TaZrN, or TaZr, the etching stop materials are Cr, CrN, CrO, CrON, Ta, TaN, and/or TaBN.

These etching stop materials can be removed with $Cl_2$ etching gas. When $Cl_2$ is used as the etching gas for absorber Cr, CrN, CrO, CrON, Ta, TaN, or TaBN, the etching stop materials are MoSi, MoSiN, MoSiON, TaN, TaON, TaB, TaBN, TaHfN, TaHf, TaSi, TaSiN, TaGe, TaGeN, TaZrN, and/or TaZr. These etching stop layer materials can be removed with $CHF_3$, $CF_4$, and/or $SF_6$. When $CHF_3$, $CF_4$, and/or $SF_6$ are used as the etching gas for absorber MoSi, MoSiN, MoSiON, TaN, TaON, TaB, TaBN, TaHfN, TaHf, TaSi, TaSiN, TaGe, TaGeN, TaZrN, and/or TaZr, the etching stop materials are Cr, CrN, CrO, CrON, Ta, TaN, or TaBN.

Figure 18:
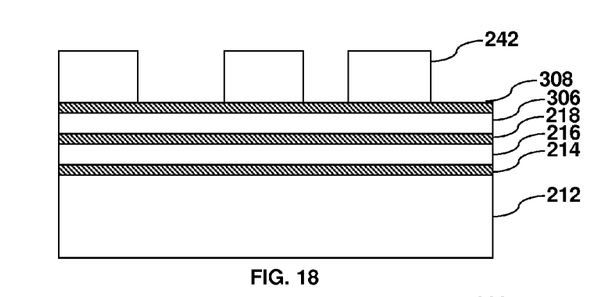
FIGS. 18-23 represent cross section views of forming a three-stage mask according to one or more embodiments of the present disclosure.

Referring now to FIGS. 18-23, cross section views of forming the stacked mask 300 (three stage stacked mask) using the method 400 are illustrated according to one or more embodiments. As shown in FIG. 18, the first absorber layer 214 is deposited over the LTEM substrate 212, the first spacer layer 216 is deposited over the first absorber layer 214, the second absorber layer 218 is deposited over the first spacer layer 216, the second spacer layer 208 is deposited over the second absorber layer 218, and the third absorber layer 308 is deposited over the second spacer layer 306. Comparing the stacked mask 200 as shown in FIG. 10, the second spacer layer 306 and the third absorber layer 308 deposited on the second spacer layer 306 are added over the second absorber layer 218 in the mask 300. In some embodiments, the materials used for the absorber layer and the spacer layer in the mask 200 can be also used for the absorber layer and the spacer layer in the mask 300 respectively.

Figure 19:
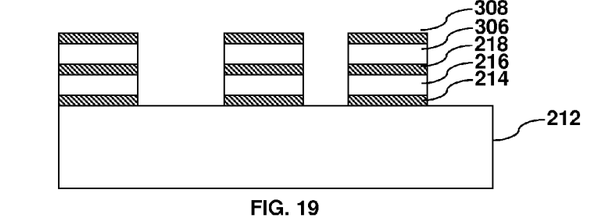
Figure 20:
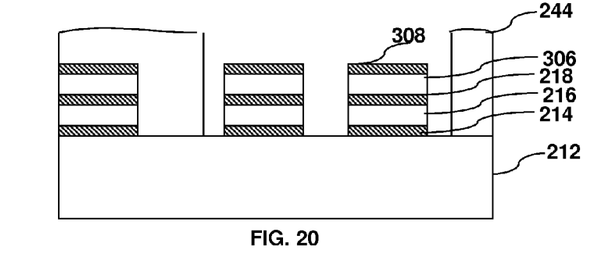
Figure 21:
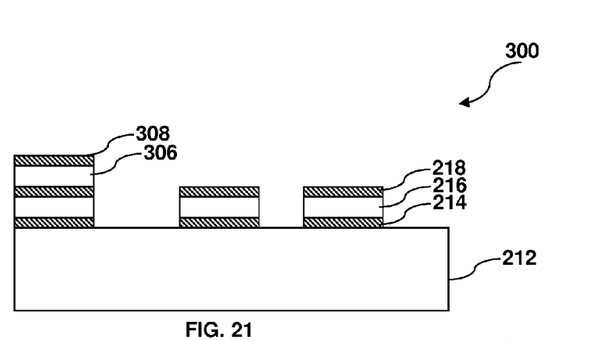
Figure 22:
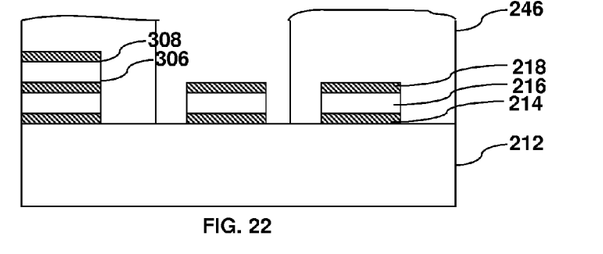
Figure 23:
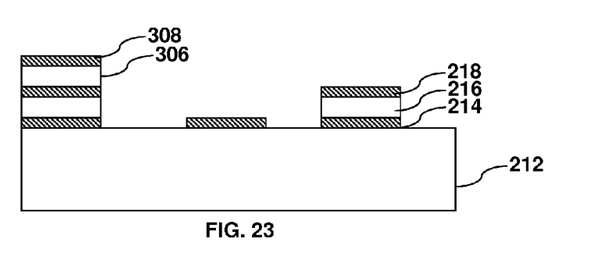

As shown in FIG. 18, the first resist film 242 is applied on the third absorber layer 308 to form the patterned first resist film 242 after coating, exposing, and developing processes. After etching, striping and cleaning process, the first stage pattern of the mask 300 is formed as shown in FIG. 19. As shown in FIG. 20, the second resist film 244 is applied over the first stage pattern of the mask 300 to form the patterned second resist film 244 after coating, exposing, and developing processes. After etching, striping and cleaning process, the second stage pattern of the mask 300 is formed as shown in FIG. 21. As shown in FIG. 22, a third resist film 246 is applied over the second stage pattern of the mask 300 to form the patterned third resist film 246 after coating, exposing, and developing processes. After etching, striping and cleaning process, the third stage pattern of the mask 300 is formed as shown in FIG. 23. In some embodiments, the etching stop layer may be used for forming the stacked mask 300 using the method 400.

Figure 24:
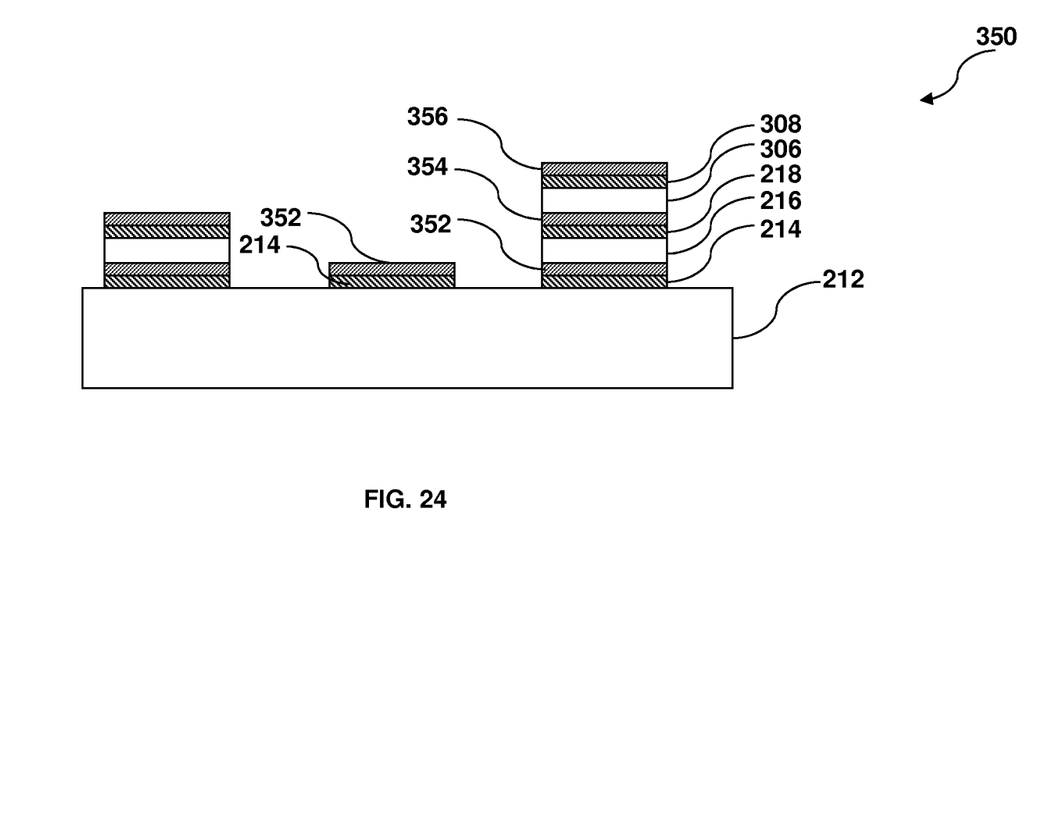
FIG. 24 is an example of a two-stage mask according to one or more embodiments of the present disclosure.

Referring now to FIG. 24, a cross section view of a stacked mask 350 fabricated by the method 400 is illustrated according to one or more embodiments. The stacked mask 350 is similar to the stacked mask 300. The staked mask 350 includes the low thermal expansion material (LTEM) substrate 212, the first absorber layer 214, the first spacer layer 216, the second absorber layer 218, the second spacer layer 306, the third absorber layer 308, a first topcoat layer 352, a second topcoat layer 354, and a third topcoat layer 356. In addition to the absorber layer and the spacer layer, the topcoat layer is added over the absorber layer for various purposes, such as anti-reflection, protection of the absorber layer, or differential etch stop. The materials used for the topcoat layer of the stacked mask 300 can also be used for the topcoat layer of the mask 350.

As shown in FIG. 24, the first absorber layer 214 is deposited over the LTEM substrate 212. The first topcoat layer 352 is deposited over the first absorber layer 214. The first spacer layer 216 is deposited over the first topcoat layer 352. The second absorber layer 218 is deposited over the first spacer layer 216. The second topcoat layer 354 is deposited over the second absorber layer 218. The second spacer layer 306 is deposited over the second topcoat layer 354. The third absorber layer 308 is deposited over the second spacer layer 306. The third topcoat layer 356 is deposited over the third absorber layer 308.

Thus, the embodiments disclosed herein describe a mask. The mask includes a low thermal expansion material (LTEM) substrate, at least two absorber layers, and a spacer layer separating the two absorber layers. The first absorber layer is deposited over the LTEM substrate. The mask further includes a topcoat layer over the absorber layer. A thickness of the spacer layer is approximate equal to height of a topography feature on a wafer substrate multiplied by the square of the demagnification of an objective lens. The absorber layers include staged patterns. The LTEM substrate includes fused silica, fused quartz, calcium fluoride ($CaF_2$), silicon carbide, or silicon oxide-titanium oxide alloy. The absorber layer includes chromium, chromium compound, molybdenum, molybdenum compound, tantalum, or tantalum compounds. The spacer layer comprises MoSi based compound, Si based compound, Ta based compound, silicon oxide or silicon oxide doped zirconium, barium, lanthanum, aluminum, sodium, phosphorus, sulfur, selenium, or tellurium. The topcoat layer comprises chromium, chromium compound, molybdenum, molybdenum compound, tantalum, or tantalum compounds.

The present disclosure also describes a method of fabricating a mask. The method includes receiving a low thermal expansion material (LTEM) substrate, depositing a first absorber layer over the LTEM substrate, depositing a first spacer layer over the first absorber layer, depositing a second absorber layer over the first space layer, and forming staged absorber layer patterns of the mask. The method further includes depositing a second spacer layer over the second absorber layer. The method further includes depositing a third absorber layer over the second absorber layer. The method further includes depositing a topcoat layer over the absorber layer. Forming the stage absorber layer patterns includes coating a resist film on the LTEM substrate, expositing the resist film, developing the exposed resist film to form a resist pattern on the LTEM substrate, and etching the LTEM substrate having the resist pattern to form the staged patterns on the LTEM substrate. Exposing the resist film includes writing the pattern to the resist film using a mask writer. Forming the stage patterns includes performing forming the stage patterns at least two times to form a first stage pattern and a second stage pattern. The method further includes aligning the second stage pattern to the first stage pattern. The method further includes inspecting the stage patterns for a defect using a mask inspection tool. The method further includes fixing the defect.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A mask comprising:
   at least two absorber layers, wherein a first absorber layer is deposited over a substrate; and
   a spacer layer separating the two absorber layers, wherein a thickness of the spacer layer is approximately equal to a height of a topography feature on a wafer substrate multiplied by the square of a demagnification of an objective lens.

2. The mask of claim 1, further comprising a topcoat layer over the absorber layer.

3. The mask of claim 1, wherein the absorber layers include staged patterns.

4. The mask of claim 1, wherein the substrate includes fused silica, fused quartz, calcium fluoride ($CaF_2$), silicon carbide, or silicon oxide-titanium oxide alloy.

5. The mask of claim 1, wherein the absorber layer comprises Cr, CrN, CrO, CrON, Mo, MoSi, MoSiN, MoSiON, Ta, TaON, TaB, TaBN, TaHfN, TaHf, TaSi, TaSiN, TaGe, TaGeN, TaZrN or TaZr.

6. The mask of claim 1, wherein the spacer layer comprises MoSi based compound, Si based compound, Ta based compound, silicon oxide or silicon oxide doped zirconium, barium, lanthanum, aluminum, sodium, phosphorus, sulfur, selenium, or tellurium.

7. The mask of claim 1, wherein the topcoat layer comprises CrN, CrON, CrO, TaO, TaON, SiO, $SiO_2$, SiN, or SiON.

8. A stacked mask comprising:
   a low thermal expansion material (LTEM) substrate;
   at least two absorber layers including a first absorber layer and a second absorber layer, wherein the first absorber layer is deposited over the LTEM substrate; and
   a spacer layer separating the two absorber layers, wherein a thickness of the spacer layer is approximately equal to a height of a topography feature on a wafer substrate multiplied by a square of a demagnification of an objective lens.

9. The mask of claim 8, further comprising a topcoat layer over the first absorber layer, the second absorber layer, or both.

10. A method of fabricating a mask, the method comprising:
    receiving a low thermal expansion material (LTEM) substrate;
    depositing a first absorber layer over the LTEM substrate;
    depositing a first spacer layer over the first absorber layer, wherein a thickness of the first spacer layer is approximately equal to a height of a topography feature on a wafer substrate multiplied by the square of a demagnification of an objective lens;
    depositing a second absorber layer over the first spacer layer; and
    forming staged absorber layer patterns of the mask.

11. The method of claim 10, further comprising depositing a second spacer layer over the second absorber layer.

12. The method of claim 11, further comprising depositing a third absorber layer over the second absorber layer.

13. The method of claim 10, further comprising depositing a topcoat layer over the first absorber layer, the second absorber layer, or both.

14. The method of claim 10, wherein forming the stage absorber layer patterns includes coating a resist film on the LTEM substrate, expositing the resist film, developing the exposed resist film to form a resist pattern on the LTEM substrate, and etching the LTEM substrate having the resist pattern to form the staged patterns on the LTEM substrate.

15. The method of claim 14, wherein exposing the resist film includes writing the resist pattern to the resist film using a mask writer.

16. The method of claim 14, wherein forming the stage patterns includes forming a first stage pattern and a second stage pattern.

17. The method of claim 16, further including aligning the second stage pattern to the first stage pattern.

18. The method of claim 10, further comprising inspecting the stage patterns for a defect using a mask inspection tool, wherein the inspecting the stage patterns includes fixing the defect.

19. The method of claim 10, further comprising forming a resist pattern on the wafer substrate using the mask.

20. The mask of claim 8, further comprising another spacer layer formed over the second absorber layer, and
   wherein the at least two absorber layers further includes a third absorber layer disposed over the another spacer layer such that the another spacer layer separates the second and third absorber layers.

* * * * *